United States Patent [19]

Miyoshi et al.

[11] Patent Number: 4,912,052
[45] Date of Patent: Mar. 27, 1990

[54] METHOD OF TESTING SEMICONDUCTOR ELEMENTS

[75] Inventors: Motosuke Miyoshi, Tokyo; Katsuya Okumura, Yokohama, both of Japan

[73] Assignee: Kabushiki Kaisha Toshiba, Kawasaki, Japan

[21] Appl. No.: 248,137

[22] Filed: Sep. 23, 1988

[30] Foreign Application Priority Data

Sep. 26, 1987 [JP] Japan .................................. 62-241629

[51] Int. Cl.[4] ........................ H01L 21/66; G01R 19/00
[52] U.S. Cl. ..................................... 437/8; 324/158 R
[58] Field of Search ................... 324/158 R; 437/8, 51

[56] References Cited

U.S. PATENT DOCUMENTS

| | | | |
|---|---|---|---|
| 4,464,571 | 8/1984 | Plies | 324/158 R |
| 4,554,455 | 11/1985 | Todokoro et al. | 324/158 R |
| 4,609,867 | 9/1986 | Schnik | 324/158 R |
| 4,733,174 | 3/1988 | Crosby | 324/158 R |
| 4,748,407 | 5/1988 | Brunner et al. | 324/158 R |
| 4,766,372 | 8/1988 | Rao | 324/158 R |
| 4,786,865 | 11/1988 | Arimura et al. | 324/158 R |
| 4,788,495 | 11/1988 | Plies | 324/158 R |
| 4,807,159 | 2/1989 | Komatsu et al. | 324/158 R |

FOREIGN PATENT DOCUMENTS

| | | | |
|---|---|---|---|
| 0126933 | 10/1981 | Japan | 324/158 R |
| 0045465 | 3/1982 | Japan | 324/158 R |

OTHER PUBLICATIONS

Fazekasi, "Scanning Electron Beam Probes VLSI Chips", Electronics, Jul. 14, 1981, pp. 105–112.
H. Fujioka, "Electron–Beam Control of Potentials on an Electrically Floating Target", Proc. the Electron Beam Testing Symposium by the 132nd Committee, Japan Society of Promotion of Science, vol. 97, 1968, pp. 69–74.
M. Yoshizawa et al., "In-Process Testing Method of LSI Elements by Electron Beam Probe", Proc. Institute of Electronics and Communication Engineers of Japan, vol. 2, 1986, p. 135.

Primary Examiner—Brian E. Hearn
Assistant Examiner—T. Thomas
Attorney, Agent, or Firm—Foley & Lardner, Schwartz, Jeffery, Schwaab, Mack, Blumenthal & Evans

[57] ABSTRACT

This invention concerns a method and an apparatus for measuring and testing the electric characteristic of a semiconductor device in a non-contact fashion. For conducting measurement and testing in a non-contact fashion, an electron beam is used to induce a voltage, on a semiconductor device which is an object to be tested (an object to be measured.) By changes with lapse of time of the induced voltage, the electric characteristic, of the semiconductor device are determined. Thus, an electron beam is irradiated to an object to be tested to induce a voltage thereafter to examine changes in the induced voltage. Then, the electric characteristic of the semiconductor device is measured and tested from the voltage thus induced and the voltage measured thereafter.

10 Claims, 5 Drawing Sheets

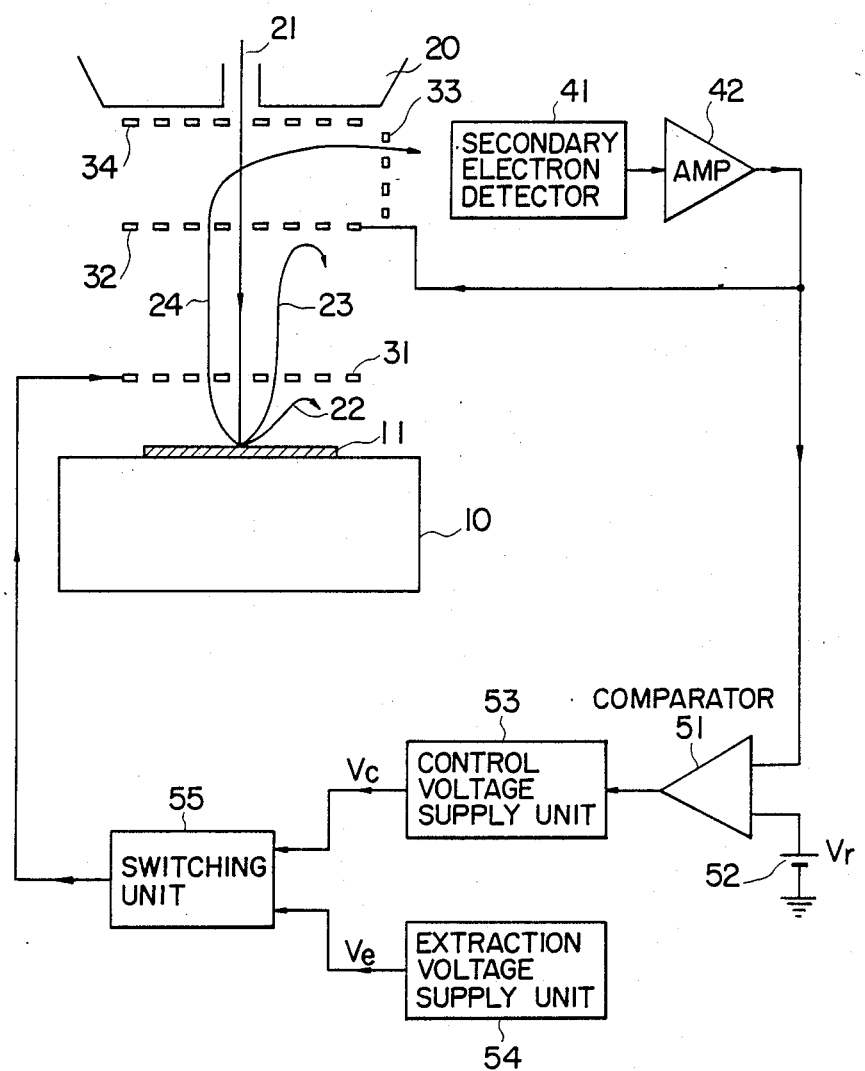
F I G. 1

METHOD OF TESTING SEMICONDUCTOR ELEMENTS

BACKGROUND OF THE INVENTION

1. (Applied Field in Industry.)

This invention relates to a testing method for semiconductor elements and a testing apparatus therefore, and more particularly, to a testing method and a testing apparatus for testing respective elements not in contact with the semiconductor substrate.

2. (Prior Art)

For improving the reliability of semiconductor devices, it is very important to conduct characteristics test of respective semiconductor elements. In the prior art, a dedicated monitor element for conducting this test was prepared to allow a measurement probe to be mechanically in contact with the respective terminals of this monitor element to apply voltages thereto to measure output signals, thereby conducting a test.

3. (Problems that the Invention Intends to Solve)

However, the conventional testing method has the following problems.

(1) Because it is necessary to allow the metallic probe to be mechanically in contact with the terminals, there is the possibility that breakdown and/or damage due to contact may occur.

(2) Since it is necessary to form a terminal having a dimension sufficient to allow the probe to be in contact therewith (ordinarily, in the order of $60 \times 60$ $\mu$m) on the semiconductor substrate, the provision of such a terminal becomes an obstacle to integration.

(3) Until the process for manufacturing terminals for allowing the probe to be in contact therewith is completed, tests cannot be carried out.

SUMMARY OF THE INVENTION

With the above in view, an object of this invention is to provide a testing method for semiconductor elements an a testing apparatus therefore capable of making the characteristic test of semiconductor elements without allowing the probe to be in contact with the semiconductor substrate.

In particular, a method of testing semiconductor elements is provided that includes:

utilizing a voltage induction stage for irradiating an electron beam to one electrode of a capacitor connected in parallel with elements to be tested formed on a semiconductor substrate to thereby inject charges thereinto, thus to induce a predetermined voltage on the electrode by the charge injection, and utilizing a voltage measurement stage for irradiating an electron beam to terminals of electrodes of the elements to be tested to observe secondary electrons emitted from the terminals to measure voltage appearing on the terminals, thus to make a test of the elements to be tested on the basis of the relationship between the voltage induced at the voltage induction stage and the voltage measured at the voltage measurement stage.

Further, an apparatus for testing semiconductor elements is provided which includes:

electron beam generator means for irradiating an electron beam to a predetermined target on a semiconductor substrate on which semiconductor elements are formed, a grid provided between the electron beam generator means and the semiconductor substrate, control voltage supply means for supplying a control voltage to the grid in order to control a voltage induced on the target by irradiation of the electron beam, extraction voltage supply means for supplying an extraction voltage to the grid in order to extract or draw secondary electrons emitted from the target, switching means for connecting either the control voltage supply means or the extraction voltage supply means to the grid, and secondary electron detector means for detecting a quantity of secondary electrons which have passed the grid.

In addition, this invention provides a non-contact testing method using an electron beam to irradiate an electron beam to a capacitive object to be measured to inject charges thereinto and thereby induce a voltage on the object to be measured so as to measure a voltage on the object to be measured after a predetermined time has passed by using an electron beam, thereby measuring the electrical parameters of the object to be measured.

In the test of semiconductor elements according to this invention, a capacitor connected in parallel with elements to be tested is utilized. For this capacitor, a capacitor for testing may be formed in advance in the manufacturing process of the semiconductor device, or a capacitor provided for performing the function peculiar to the device may be utilized. For testing the characteristic of the semiconductor element, it is sufficient to realize two functions, i.e., to deliver a voltage to a predetermined terminal of the element to be tested, and to measure a voltage appearing on that terminal. In this invention, such two functions are performed by irradiation of an electron beam. Namely, by irradiating an electron beam to the capacitor connected in parallel with the element to be tested, thus to therefore charge the capacitor, it is possible to deliver a voltage to a predetermined terminal of the element. In addition, by irradiating an electron beam to that terminal to observe secondary electrons emitted therefrom, it is possible to measure a voltage appearing on that terminal.

Accordingly, testing of elements can be made without allowing the probe to be mechanically touched.

BRIEF DESCRIPTION OF THE DRAWINGS

In the accompanying drawings:

FIG. 1 is a block diagram showing the configuration of testing apparatus for semiconductor elements according to an embodiment of this invention.

DESCRIPTION OF THE PREFERRED EMBODIMENTS

Configuration of the Testing Apparatus

Figure 2:
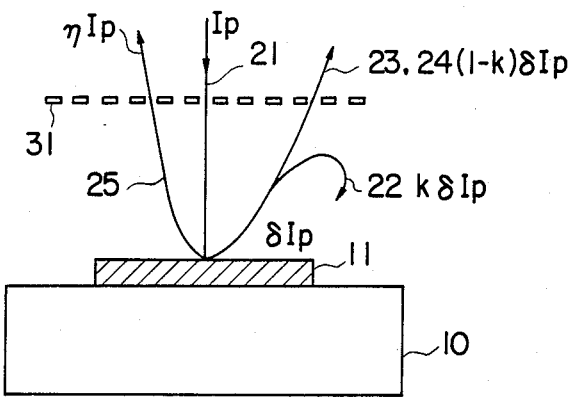
FIG. 2 is a view for explaining the operation o the apparatus shown in FIG. 1.

This invention will be described on the basis of an embodiment illustrated. FIG. 1 is a block diagram showing the configuration of a testing apparatus for semiconductor elements according to an embodiment of this invention. On a semiconductor substrate 10, elements to be tested (not shown) which are subject to testing are formed. Electron beam is irradiated onto a target 11 connected to the elements to be tested. An electron beam generator 20 irradiates electron beam 21 toward the target 11. Between the electron beam generator 20 and the target 11, four grids 31 to 34 are provided. The electron beam 21 passes in order of grids 34, 32 and 31, and is irradiated to the target 11. As result, secondary electrons 22, 23 and 24 re emitted from the target 11. In this example, secondary electron 22 is an electron driven back by grid 31, secondary electron 23 is an electron driven back by grid 32, and secondary electron 24 is an electron deflected by grid 33. The secondary electron 24 is detected by a secondary electron detector 41. The secondary electron detector 41 outputs a voltage corresponding to a quantity thus detected. This output voltage is amplified at an amplifier 42, and is then delivered to the grid 32.

On one hand, the voltage amplified by the amplifier 42 is compared with a reference voltage $V_r$ produced from a reference power supply 52 at a comparator 51. The compared result is delivered to a control voltage supply unit 53. This control voltage supply unit 53 produces control voltage $V_c$ corresponding to an input. On the other hand, extraction voltage supply unit 54 produces an extraction voltage $V_e$ suitable for extracting or drawing secondary electrons from the target 11. Either the control voltage $V_c$ or the extraction voltage $V_e$ is selected by a switching unit 55. The voltage thus selected is delivered to the grid 31.

Voltage Induction Mode

This apparatus has two operational modes. First is a voltage induction mode for inducing a voltage on the target 11. Second is a voltage measurement mode for measuring a voltage appearing on the target 11. The apparatus is operative in either of two modes. The first voltage induction mode will be initially described.

This voltage induction mode is a mode to irradiate electron beam 21 to target 11 to thereby carry out charge injection, thus to induce a predetermined voltage on he target 11. The control of the electron beam 21 in this mode is carried out at the grid 31. The fundamental principle thereof will be described with reference to FIG. 2. When it is assumed that electron beam 21 corresponding to a current $I_p$ is irradiated to the target 11, this electron beam 21 passes through the grid 31 to reach the target 11. At this time, a portion thereof is reflected on the surface of the target 11 as it is to serve as a reflected electron 25, a further portion thereof contributes to emission of secondary electrons 22, 23 and 24, and a still further portion thereof is accumulated or stored as charge. Assuming now that the coefficient of reflection and the secondary electron emission ratio are designated by $\eta$ and $\delta$, respectively, the quantity of the reflected electron 25 and the total quantity of the secondary electrons 22, 23 and 24 are represented by $\eta I_p$ and $\delta I_p$, respectively. However, when a predetermined voltage is applied to the grid 31, a portion 22 of the secondary electrons emitted is driven back by the grid 31. The secondary electrons which actually pass through the grid 31 and are then emitted are only electrons 23 and 24. If drive back coefficient K indicating ratio of drive back is defined, the quantity of the secondary electron 22 driven back and the quantity of the secondary electrons 23 and 24 which pass through the grid 31 are expressed as $K\delta I_p$ and $(1-k)\delta I_p$, respectively.

When attention is drawn to the quantity of charge accumulated during a period of time t in the target 11, the part $\eta I_p$ is lost as the reflected electron 25 and the part $(1-k)\delta I_p$ is lost as the secondary electrons 23 and 24. Eventually, the following equations hold:

$$Q = \alpha I_p t \quad (1)$$

$$\alpha = (1 - \eta - (1-k)\delta) \quad (2)$$

Assuming now that the target 11 is one electrode of the capacitor having capacity C, after time t has passed, a voltage expressed by the following equation is induced across this electrode:

$$V = -(Q/C) \quad (3).$$

The above parameters in the above-mentioned equations, the reflection coefficient $\eta$ and the secondary electron emission ratio $\delta$ are determined exclusively by the material constituting the target 1, and the capacity C are determined exclusively by the configuration of the capacitor. Further, it is seen that the drive back coefficient K can be controlled by a voltage value applied to the grid 31. Accordingly, it is seen that the induced voltage V of the target 11 can be controlled by a voltage applied to the grid 31.

In the voltage induction mode, the switching unit 55 selects the control voltage $V_c$ to deliver it to the grid 31. Thus, the induced voltage of the target 11 can be controlled by the control voltage supply unit 53. The control operation of the control voltage supply unit 53 will be described later.

Voltage Measurement Mode

The operation of the voltage measurement mode will now be described. In the voltage measurement mode, the switching unit 55 selects the extraction voltage $V_e$ to deliver it to the grid 31. In this mode, the grid 31 functions as an extraction electrode for extracting or drawing secondary electrons from the target 11. To the grid 31, positive voltage is applied. The secondary electrons which have passed the grid 31 are accelerated, and are directed toward the grid 32 as an electron of which the velocity component in a longitudinal direction is uniform. The grid 32 performs a function to generate a blocking retarding field for discriminating the energy of the secondary electron. The secondary electron 23 having an energy lower than a predetermine energy is driven back by the grid 32.

The secondary electron 24 which has passed the grid 32 is deflected by a voltage applied to the grid 33, and is then detected by the secondary electron detector 41. The grid 34 absorbs secondary electrons produced when the reflected electron impinges on the electron beam generator 20. An indication of voltage supply means to grids 33 and 34 is omitted in FIG. 1.

The secondary electron detector 41 outputs a voltage corresponding to the quantity of secondary electron detected. This output voltage is amplified at the amplifier 42, and is then delivered to the grid 32. By the grid 32, the secondary electron detector 41 and the amplifier 42, a feedback loop is formed. Thus, such a feedback control is conducted so that a quantity of secondary electrons detected at the secondary electron detector 41 becomes equal to a constant value. Namely, when a quantity of secondary electrons detected at the secondary electron detector 41 is above a constant value, a higher voltage is applied to the grid 32. Thus, such a control to suppress an quantity of passing secondary electrons is conducted. It is seen that such a feedback control eventually allows the output of the amplifier 42 to be related to a quantity of secondary electron emitted from the target 11. Since the quantity of secondary electrons is a value related to a voltage of the target 11, the voltage of the amplifier 42 becomes equal to a value indicative of the voltage of the target 11 as it is. Thus, voltage measurement is completed.

The output of the amplifier 42 is delivered to one input terminal of the comparator 51, and is compared with reference voltage $V_r$ at this comparator 51. Since the output of the amplifier 42 becomes equal to a value indicative of the voltage of the target 11 as described above, such a comparison makes it possible to recognize whether the induced voltage of the target 11 is higher tan a desired set value (corresponding to the reference voltage $V_r$) or lower than that. The control voltage supply unit 53 controls the control voltage $V_c$ on the basis of this comparison. Accordingly, correction of a voltage delivered to the grid 31 in the voltage induction mode subsequently carried out, can be made by making use of a measured result in this voltage measurement mode.

Test Procedure of the Semiconductor Element

An actual test procedure of the semiconductor element using the apparatus shown in FIG. 1 will now be described. Basically, test is made by inducing a voltage on a predetermined target in the voltage induction mode, thereafter to measure a voltage appearing on the target in the voltage measurement mode. In accordance with a method described below, test is made by repeatedly carrying out both modes at a fixed period to measure a leakage current into the semiconductor substrate while conducting such a control to keep constant an induced voltage of the target.

Figure 3:
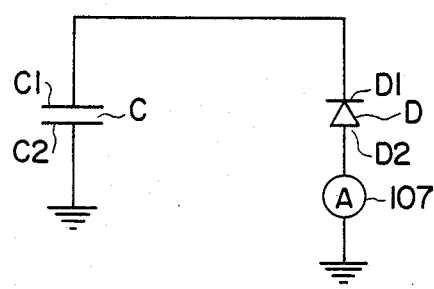
FIG. 3 is an equivalent circuit of a semiconductor device to be tested by a testing method according to this invention.
Figure 4:
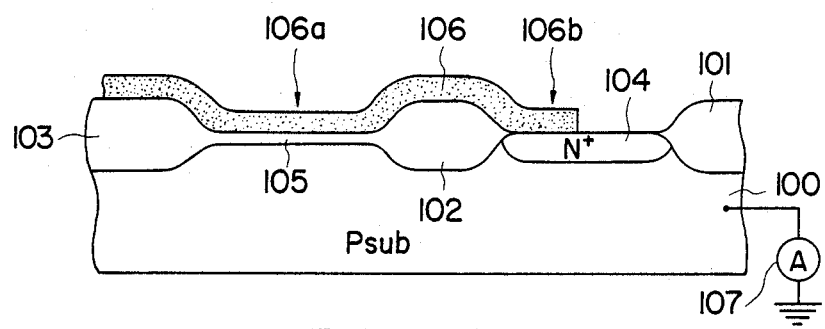
FIG. 4 is a cross sectional view showing the structure of a semiconductor device corresponding to the equivalent circuit of FIG. 3.

FIG. 3 is an equivalent circuit diagram of a semiconductor device used as a test object in this embodiment and FIG. 4 is a cross sectional view showing the structure of the semiconductor device. As shown in FIG. 4, insulating layers 101 and 102 for isolation between elements are formed on a P-type semiconductor substrate 100 and an N+ impurity diffused layer 104 is formed therebetween. The PN junction formed between the impurity diffused layer 104 and the semiconductor substrate 100 corresponds to the diode in the equivalent circuit of FIG. 3. In this embodiment, this diode D serves as an element to be tested. For testing this diode D, capacitor C is provided. This capacitor C is provided in parallel with the diode D which is the element to be tested. In the structural view of FIG. 4, this capacitor C is constituted with an insulating film 105 between element isolation insulating layers 102 and 103, and a wiring layer 106 and the semiconductor substrate 100 between which the insulating film 105 is provided. Namely, the first electrode C1 of the capacitor C corresponds to the wiring layer 106, and the second electrode C2 thereof corresponds to the semiconductor substrate 100. The wiring layer 106 is in contact with the impurity diffused layer 104. It will be thus understood that FIG. 3 is the equivalent circuit of the structure shown in FIG. 4. In this example, this capacitor C is specially formed for testing the diode D. However, since capacitors are generally distributed everywhere in the semiconductor device, capacitors designed for performing the function peculiar to the device may be utilized as they are.

Initially, the apparatus shown in FIG. 1 is operated in the voltage induction mode to induce a predetermined voltage on the electrode $C_1$. At this time, an electron beam is irradiated with the portion of wiring layer 106a in FIG. 4 being a target. It is preferable that the spacing between the surface of the semiconductor substrate and the grid 31 be about 2 mm and that the electron beam has an energy of about 1 KeV. If the energy of the electron beam is too high, unfavorable phenomenon such as damage due to irradiation or charging of the peripheral insulating film wound occur. The quantity Q of charge accumulated into the electrode $C_1$ by this irradiation is determined by the above-mentioned equation (1), and is saturated at an induced voltage V shown by the above-mentioned equation (3). It has been described that the induced voltage V can be controlled by the control voltage Vc.

Subsequently, this apparatus is operated in the voltage measurement mode. At this time, the electron beam is irradiated with the portion of wiring layer 106b in FIG. 4 being a target. Since the element to be tested is not capacitor C but diode D, the accuracy of the measurement at the portion 106b is still more improved than that at the portion 106a in order to measure a voltage on one terminal D1 of the diode D. As described above, the induced voltage of the portion 106b is measured y such a measurement. The control voltage supply unit 53 obtains as a feedback quantity, a compared value between the measured value and the reference voltage Vr.

Then, this apparatus is operated in the voltage induction mode for a second time. The irradiation position of the electron beam is also set again to the portion 106a. At this time, the control voltage supply unit 53 outputs a control voltage corrected in consideration of the feedback quantity given.

In a manner stated above, by interchangeably repeating the voltage induction mode and the voltage measurement mode, it is possible to control a voltage induced on one terminal D1 of the diode which is the element to be tested so that it becomes equal to a desired value, and at the same time to precisely measure its voltage value. When the terminal D1 is inducted so that a reverse bias is applied to the diode D1, a reverse bias leakage current flows in the diode D. B measuring this leakage current using an electric current meter 107 externally connected, it is possible to recognize the characteristic of the diode D, thus permitting the characteristic test.

An explanation has been made by taking an example of the characteristic test of the diode, but a similar test may be conducted also for other elements. For example, for MOS transistor, it is sufficient to generate a desired induced voltage on the gate electrode to measure various characteristics. In short, the method according to this method can induce a desired voltage at a desired position on the semiconductor substrate, and to precisely measure that induced voltage. In addition, since such a measurement can be made in a non-contact manner, there is no need to allow the probe to be in mechanical contact with the semiconductor substrate as in the conventional method, and the necessity of forming contact pads is also eliminated, with the result that test can be made at any one of manufacturing processes for semiconductor devices.

Test in Regard to Capacitive Load

Figure 5:
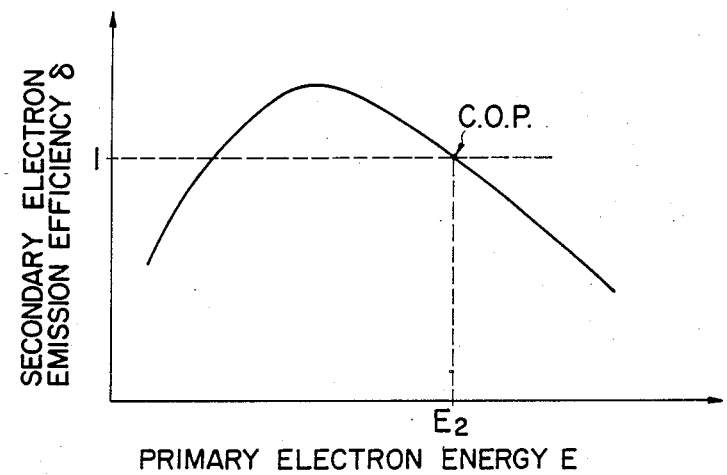
FIG. 5 is a characteristic curve showing the characteristic underlying the principle of this invention.

FIG. 5 shows the characteristic underlying the principle of this invention. When the primary energy E and the secondary electron emission efficiency are plotted on the abscissa and the ordinate, respectively, the primary electron energy E has a certain peak value. When the primary electrons are accelerated using an acceleration voltage of $E_2$ higher than this peak value, the secondary electrons are produced in proportion to the quantity of primary electrons. Namely, $\delta = 1$. This point is called crossover point C.O.P.

When the primary electron energy E has the inequality relationship expressed as $E < E_2$, the secondary electron emission efficiency $\delta$ becomes larger than 1. In contrast, when that every E has the inequality relationship expressed as $E > E_2$, the secondary electron emission efficiency $\delta$ becomes smaller than 1. When the secondary electron emission efficiency $\delta$ becomes larger than 1, positive charges are accumulated into the object to be measured. On the contrary, when the secondary electron emission efficiency $\delta$ becomes smaller than 1, negative charges are accumulated into the object to be measured.

Figure 6:
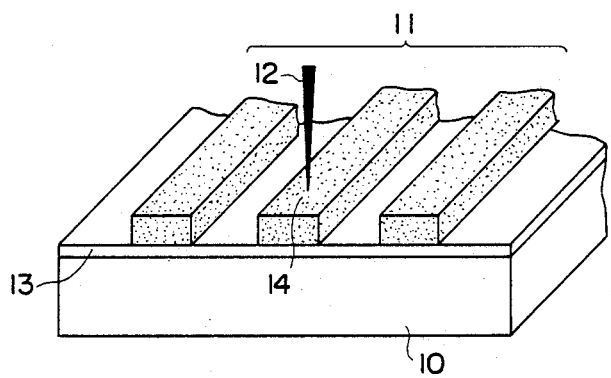
FIG. 6 is an explanatory view showing a pattern subject to irradiation of electron beam by this invention.

FIG. 6 shows a pattern which is the object to be irradiated by such an electron beam. An electron beam 12 is irradiated onto a polysilicon pattern 11 formed on a silicon substrate 10. The polysilicon pattern 11 is formed on an oxide film 13 1000 Å thick formed on the silicon substrate 10. Polysilicon is ordinarily used for internal wiring of gate electrode or LSI. This process is present at an early stage of the entire process sequence. In-process inspection cannot be conducted with the conventional technique.

When electron beam 12 is irradiated to one end portion 14 of the polysilicon pattern, the following phenomenon occurs because this pattern is fundamentally a capacitor.

As described above, when an electron beam of $E = E_2$ is irradiated, any electric change is not caused on the polysilicon pattern. On the contrary, when an electron beam of $E < E_2$ or $E > E_2$ is irradiated, positive or negative charges are accumulated into the polysilicon pattern. Accordingly, when $E < E_2$, a positive voltage is induced, while when $E > E_2$, a negative voltage is induced. That voltage $V_G$ is expressed as follows:

$$V_G = -(Q/C) \qquad (4)$$

where C is a capacity of the capacity that the pattern forms, and Q is a quantity of charges irradiated at time $t_1$ and accumulated.

Figure 7:
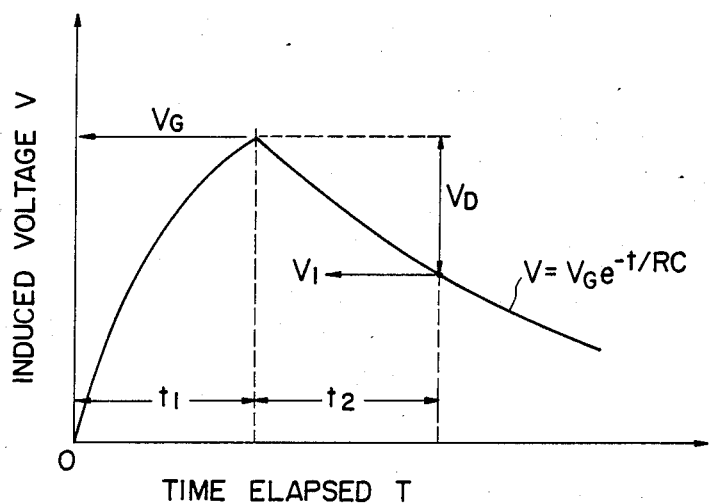
FIG. 7 is an explanatory view showing the manner of changes in voltage $V_G$ induced on the pattern shown in FIG. 6, FIGS. 8(a) and (b) are explanatory views showing examples of abnormal states in an object to be measured which is tested by the method according to this method, respectively.

FIG. 7 shows the behavior of changes in the voltage $V_G$. When $V_G$ has reached a predetermined voltage value, ordinarily $+5$ volts, the irradiation is stopped. When the irradiation is stopped, the capacitor begins discharging. Thus, charging voltage becomes equal to a voltage expressed below:

$$V = V_G e^{-t/RC} \qquad (5).$$

$V_G$ becomes equal to voltage value $V_1$ determined by the capacity C and the parallel resistor after a predetermined time $t_2$ has passed.

The measurement of the voltage $V_1$ shown by the characteristic curve of FIG. 7 is carried out with a measurement accuracy of several ten mV by using the same electron beam as that used for injection of charges to conduct an energy analysis of secondary electrons generated by irradiation of the electron beam using an energy analyzer. As a result, complete non-contact measurement can be conducted. In this case, it is important to separately use the energy of the primary electron beam for voltage induction and the energy at the time of measurement. For eliminating the influence of the measurement work, it is necessary to conduct a measurement at an energy of the crossover point C.O.P.

Since the resistor R can be considered to have a fixed resistance if no special defect is present in the gate oxide film the voltage value $V_1$ is dependent upon the capacity C. If the resistance of the resistor R is measured in advance and is taken as a known fixed value, the capacity C is determined from a voltage decrease $V_D$ obtained from the voltage value $V_1$. This capacity C is determined as follows:

$$C = \epsilon \times D \times L / d \qquad (6)$$

where the dielectric constant $\epsilon$ and the thickness d of the oxide film are determined by the sample structure and are fixed values, respectively. In contrast, if the pattern has any defect, an error in the value of the capacity C occurs.

Figure 8:
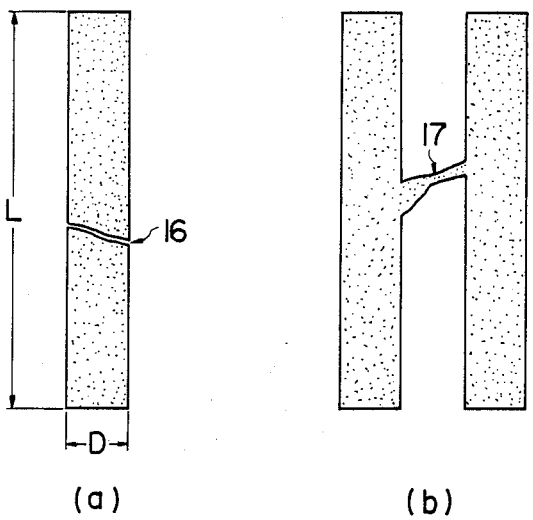

FIGS. 8(a) and (b) show examples where a measurement object tested by the method according to this invention is in an abnormal state. When a disconnection 16 is present in the middle of the pattern as shown in FIG. 8(a), the length L of the pattern becomes small to a great extent and the capacity C also becomes small. On the other hand, when a short-circuit 17 is present between the pattern and a pattern adjacent thereto as shown in FIG. 8(b), the capacity C becomes equal to a value including the capacity of the adjacent pattern as well, and therefore indicates a large value.

The pattern of this kind has the relationship between the length L and the width expressed as $L >> D$. Accordingly, if the value of the capacity C is equal to a value in the vicinity of the expectation value mainly determined from the dimension of the pattern and shows unevenness, it can be said that this is the unevenness due to the line width D.

Figure 9:
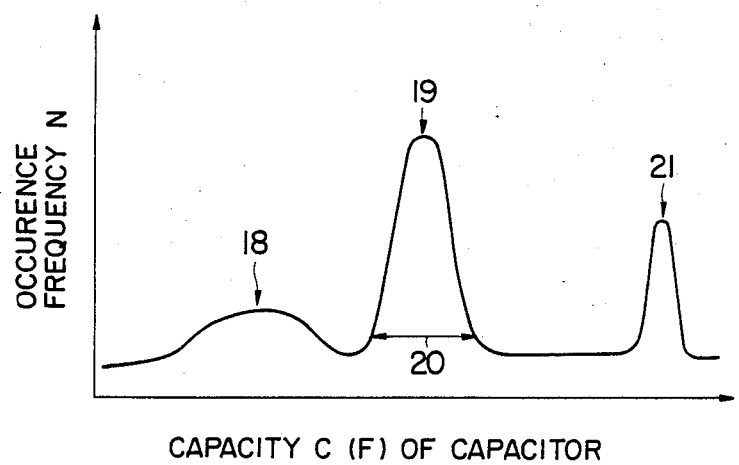
FIG. 9 is a histogram obtained by measuring a large number o patterns to plot values of the capacitance C on the abscissa and occurrence frequence on the ordinate.

FIG. 9 is a histogram obtained by measuring a large number of patterns to plot the value of the capacity C on the abscissa and the occurrence frequency on the ordinate. In this histogram, reference 18 denotes a pattern disconnection, reference number 19 a normal pattern, reference number 20 an unevenness of the pattern line width, and reference number 21 an unevenness of the capacity due to short-circuiting. Results patterned according to abnormal causes are obtained.

Accordingly, the testing method according to this invention permits measurement of disconnection and short-circuiting of the pattern, and the line width value of the pattern and unevenness thereof. In addition, such a measurement can be carried out in a non-contact manner and at the same time.

Figure 10:
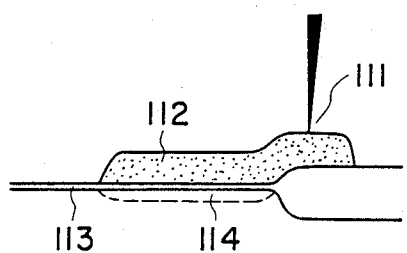
FIG. 10 is an explanatory view showing an example in which this invention is applied to a further measurement object.

FIG. 10 shows an example where this invention is applied to a further measurement object. In this example, test of the electric characteristic of a capacity such as a memory cell in dynamic RAM is made. For the measurement parameter in this case, the leakage characteristic is important. This appears as a parallel resistor with respect to a capacitor composed of a polysilicon 112, a gate oxide film 113, and a memory cell side element 114. In terms of the characteristic of FIG. 7, when the capacity C is taken as a constant in an opposite manner to that in the above-mentioned example in the discharging characteristic, the voltage increase $V_D$ after time t1 has passed depends upon the parallel resistor R as a result of discharging.

FIG. 10 shows the state immediately after the capacitor portion of the memory cell is formed, wherein measurement can be carried out immediately after the process is completed. By conducting the same measurement as that having been described with reference to FIGS. 5 to 7 at a measurement point 111 in FIG. 10, it is possible to individually measure the leakage characteristic which is the most important in the dynamic RAM.

Figure 11:
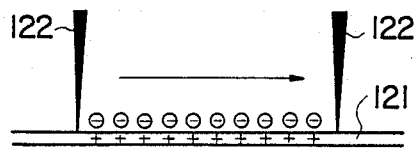
FIG. 11 is an explanatory view showing an example in which this invention is applied to a still further measurement object.

FIG. 11 shows the case where this invention is applied to a still further measurement object. In this case, the withstand voltage characteristic (leakage characteristic) is measured in the state before the conductive film is formed. While the electron beam is irradiated to a fixed point because the conductive film is utilized in the example of FIG. 10, an electron beam 112 is face-irradiated directly to an insulating film 121 to uniformly charge the insulating film to induce a voltage in this example.

In place of the surface irradiation, the spot diameter of the electron beam may be widened to partially effect surface irradiation.

Since measurement i conducted using an electron beam permitting the spot diameter to be less than 0.2 μm, a fine pattern of the order of 0.4 μm can be easily subjected to probing. As a result, the body pattern of the product wafer can be directly measured instead of the monitor pattern, testing can be made with the necessary and minimum configuration immediately after the process is completed, and feedback to the process is readily enabled by in-process measurement. Further, because only the electron beam is used and no mechanical contact is not conducted, there is no occurrence of breakdown or foreign matter due to the mechanical contact. In addition, in the case of the electron beam, high precision positioning control is possible and high speed automation is easy.

What is claimed is:

1. A method of testing semiconductor elements comprising:

a voltage induction stage for irradiating one electrode of a capacitor connected in parallel with elements to be tested that are formed on a semiconductor substrate with an electron beam, to thereby inject charges thereinto and induce a predetermined voltage on said electrode, and a voltage measurement stage for irradiating a terminal of said electrode of said elements to be tested with an electron beam, to observe secondary electrons emitted from said terminal to thereby measure a voltage appearing on said terminal to test said elements on the basis of the relationship between the voltage induced at said voltage induction stage and the voltage measured at said voltage measurement stage.

2. A method of testing semiconductor elements as set forth in claim 1, wherein, at said voltage induction stage, a grid is provided above said electrode of said capacitor to control a voltage appearing on said grid to thereby effect a control of an induced voltage.

3. A method of testing semiconductor elements as set forth in claim 2, wherein, at said voltage measurement stage, voltages for extracting and drawing secondary electrons are alternately applied to said grid provided above said electrode.

4. A method of testing semiconductor elements as set forth in any one of claims 1 to 3, wherein said capacitor is formed together with said elements in a semiconductor manufacturing process.

5. A method of testing semiconductor elements as set forth in claim 2, wherein said capacitor is formed together with said elements in a semiconductor manufacturing process.

6. A method of testing semiconductor elements as set forth in claim 3, wherein said capacitor is formed together with said elements in a semiconductor manufacturing process.

7. A non-contact testing method comprising: using an electron beam to irradiate a capacitive object to be measured to inject charges thereinto, thereby inducing a voltage on said object to be measured, and measuring a voltage on said object to be measured after a predetermined time period has passed by using an electron beam, thereby measuring electric parameters of said object to be measured.

8. A non-contact testing method using an electron beam as set forth in claim 7, wherein an electron beam for injecting charges and an electron beam for measurement are activated at optimum acceleration voltages, respectively.

9. A non-contact testing method using an electron beam as set forth in claim 7, wherein electron beams from the same beam generator are used for injection of charges and measurement, respectively.

10. A non-contact testing method using an electron beam as set forth in claim 7, wherein electron beams from individual beam generators are used for injection of charges and measurement respectively.

* * * * *